(12) United States Patent
Nishiyama et al.

(10) Patent No.: US 8,514,030 B2
(45) Date of Patent: Aug. 20, 2013

(54) OVEN-CONTROLLED CRYSTAL OSCILLATOR AND MANUFACTURING METHOD OF THE SAME

(75) Inventors: Daisuke Nishiyama, Sayama (JP);
Hiroyuki Murakoshi, Sayama (JP);
Kenji Kasahara, Sayama (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 8 days.

(21) Appl. No.: 13/253,373

(22) Filed: Oct. 5, 2011

(65) Prior Publication Data

US 2012/0098610 A1    Apr. 26, 2012

(30) Foreign Application Priority Data

Oct. 8, 2010 (JP) ............................... P 2010-228957
Sep. 15, 2011 (JP) ............................... P.2011-201417

(51) Int. Cl.
*H03B 5/32* (2006.01)
*H03B 1/02* (2006.01)
*B23K 35/12* (2006.01)
*B23K 1/20* (2006.01)

(52) U.S. Cl.
USPC .............. 331/158; 331/68; 228/245; 228/208

(58) Field of Classification Search
USPC ............... 331/66, 68, 69, 158; 228/126, 131, 228/132, 203, 208, 245
See application file for complete search history.

(56) References Cited

U.S. PATENT DOCUMENTS 7,345,552 B2 * 3/2008 Ito et al. ........................ 331/69
2004/0259434 A1* 12/2004 Pitzele ......................... 439/884
2005/0230457 A1* 10/2005 Kay et al. ..................... 228/260

FOREIGN PATENT DOCUMENTS

| JP | 2005-303612 | 10/2005 |
| JP | 2010-080945 | 4/2010 |
| JP | 2010-093536 | 4/2010 |

* cited by examiner

*Primary Examiner* — Ryan Johnson
(74) *Attorney, Agent, or Firm* — Jacobson Holman PLLC

(57) ABSTRACT

Provided are an oven controlled crystal oscillator in which in a case where a metal lead is soldered to a substrate, even if cracks occur in the solder, its reliability is not reduced, and a production method. That is, an oven controlled crystal oscillator in which pre-tinning solders are formed around openings on a front surface and a rear surface of a substrate in which of a through hole for passing a metal lead therethrough is formed; and in a state where a metal lead including a solder layer (a pre-tinning solder) formed on its surface is inserted into the through hole of the substrate, the metal lead extending from the openings is soldered to the openings on the front surface and the rear surface of the substrate, so as to form a main solder, and a production method of the oven controlled crystal oscillator are provided.

8 Claims, 1 Drawing Sheet

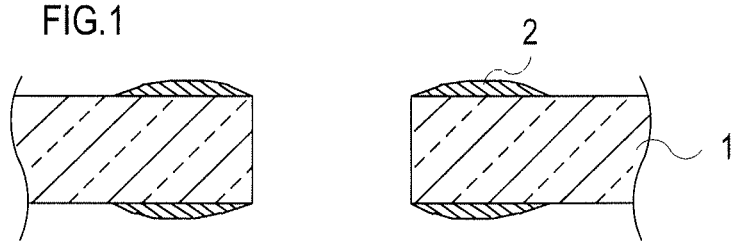
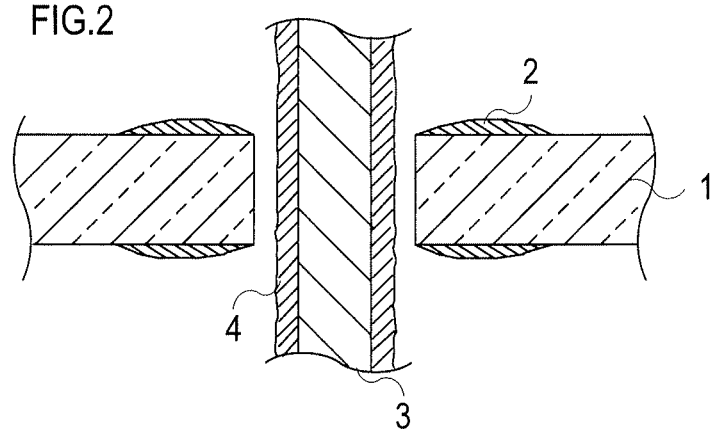
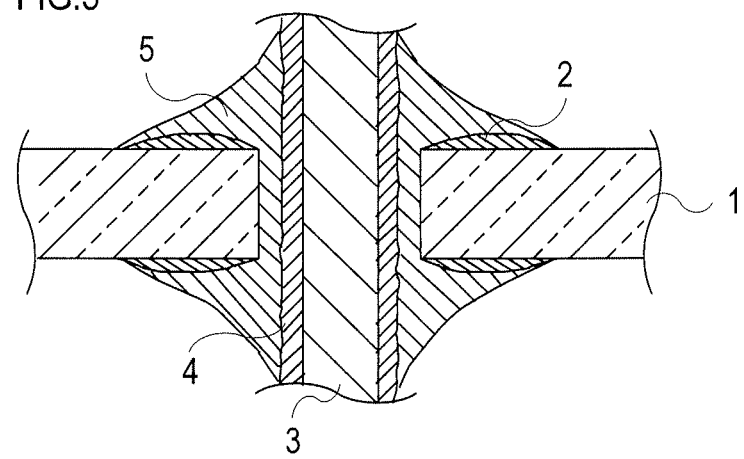

OVEN-CONTROLLED CRYSTAL OSCILLATOR AND MANUFACTURING METHOD OF THE SAME

This application has a priority of Japanese no. 2010-228957 filed Oct. 8, 2010, and no. 2011-201417 filed Sep. 15, 2011, hereby incorporated by reference.

BACKGROUND OF THE INVENTION

1. Field of the Invention

The present invention relates to an oven controlled crystal oscillator (OCXO: Oven Controlled Crystal Oscillator). More specifically, the present invention relates to an oven controlled crystal oscillator in which, in a case where a metal lead is soldered to a substrate, cracks are hard to occur in the solder and its reliability can be secured, and a production method of the oven controlled crystal oscillator.

2. Description of the Related Art

[Prior Art]

In order to increase frequency stability, an oven controlled crystal oscillator attempts to stabilize frequency by controlling, in a thermostatic oven, the temperature of components which are largely affected by temperatures in a wide temperature range.

The temperature control in the oven controlled crystal oscillator is generally carried out such that a control circuit that controls a thermostatic oven carries out temperature control with the use of a differential direct-current amplifier by a resistance bridge using a thermistor. When on/off of a power source of the thermostatic oven is repeated, a heat cycle is burdened on a using component/material, which causes a problem in reliability.

[Related Art]

Note that as related conventional techniques, there are the followings: Japanese Patent Application Laid-Open No. 2010-080945, "Method for Soldering Through-hole Mount Component, Soldering Structure of Through-hole Mount Component, and Electronic Circuit Substrate" (Sumitomo Electric System Solutions Co., Ltd.) [Patent Document 1]; Japanese Patent Application Laid-Open No. 2005-303612, "Crystal Resonator" (NIHON DEMPA KOGYO CO., LTD.) [Patent Document 2]; and Japanese Patent Application Laid-Open No. 2010-093536, "Constant-Temperature Crystal Oscillator" (NIHON DEMPA KOGYO CO., LTD.) [Patent Document 3].

Patent Document 1 discloses that: in an electronic circuit substrate, a cream solder is applied to a through-hole land of a component side and heated to be solidified, thereby forming a pre-tinning solder; then, a lead is inserted into the through hole of a substrate on which the pre-tinning solder is formed; and a solder is supplied to the through hole so as to be integrated with the pre-tinning solder.

Patent Document 2 discloses that, in a crystal resonator using a lead-free solder, in order to prevent a metal pool, a lead-free solder layer of a lead wire assumed for earth connecting is formed with some distance from a bottom surface of a metal base, which distance is larger than the distance from the bottom surface of the metal base to a lead-free solder layer of a pair of lead wires, and a recess is provided on the bottom surface of the metal base to which the lead wire for earth connecting is led.

Patent Document 3 discloses that, in a constant-temperature crystal oscillator, a circuit substrate is held by lead wires (first lead wires) made airtight by a glass of a oscillator base (a metal base), and ends of an extraction electrode which are extended from a drive electrode of a crystal blank is held by a supporter in which a crystal resonator is connected to a pair of lead wires (second lead wires) of the metal base.

[Patent Document 1] Japanese Patent Application Laid-Open No. 2010-080945

[Patent Document 2] Japanese Patent Application Laid-Open No. 2005-303612

[Patent Document 3] Japanese Patent Application Laid-Open No. 2010-093536

However, such conventional crystal oscillators have the following problem. That is, in a case where a glass epoxy resin is used for a circuit substrate, when a lead terminal for connecting the circuit substrate to a base, a pin for connecting it to another circuit substrate, or a lead-terminal equipped crystal resonator is soldered, a distortion centers on an applied solder in an operating environment in which a heat cycle occurs, because of a difference in linear expansion coefficient between the substrate made from a glass epoxy resin material and the metal terminal. This results in an occurrence of cracks in the solder.

Here, as to the linear expansion coefficient of the glass epoxy resin material, for a common CEM (Composite Epoxy Material) –3, the coefficient is 25 ppm/° C. in a longitudinal direction, 28 ppm/° C. in a lateral direction, and 65 ppm/° C. in a thickness direction, and for a common FR (Flame Retardant) –4, the coefficient is 13 ppm/° C. in a longitudinal direction, 16 ppm/° C. in a lateral direction, and 60 ppm/° C. in a thickness direction.

Particularly, the oven controlled crystal oscillator (OCXO) has such a problem that in an operating environment in which on/off of a power supply is repeated, that is, an operating environment in which a heat cycle occurs, a temperature change from an ambient temperature to a thermostatic-oven-controlling temperature (e.g., 85° C.) is caused. In view of this, when a metal lead is soldered to a substrate made from a glass epoxy resin material, cracks occur in the solder, thereby resulting in that reliability cannot be improved.

Further, Patent Documents 1 and 2 do not take into consideration that a metal lead can be stably attached to a substrate and that a decrease in reliability can be prevented even if any crack occurs in a solder.

SUMMARY OF THE INVENTION

The present invention is accomplished in view of the above facts, and an object of the present invention is to provide an oven controlled crystal oscillator which, in a case where a metal lead is soldered to a substrate, can secure its reliability even if cracks occur in the solder, and a production method thereof.

In order to solve the problems of the conventional examples, the present invention is an oven controlled crystal oscillator in which: pre-tinning solders are formed around openings on a front surface and a rear surface of a substrate in which a through hole for passing a metal lead therethrough is formed; and in a state where a metal lead including a solder layer formed on its surface is inserted into the through hole of the substrate, the metal lead extending from the openings are soldered to the openings on the front surface and the rear surface of the substrate. As a result, in the case where the metal lead is soldered to the substrate, even if cracks occur in the solder, it is advantageously possible to secure reliability.

In the present invention, the oven controlled crystal oscillator is such that the pre-tinning solders are formed around the openings on the front surface and the rear surface of the substrate, but are not formed in the through hole.

In the present invention, the oven controlled crystal oscillator is such that: the metal lead has a diameter of not less than 0.2 mm but not more than 2.0 mm, and a ratio of the metal lead to the through hole in terms of diameter is not less than 0.5 but not more than 0.9.

In the present invention, the oven controlled crystal oscillator is such that: the metal lead is a lead terminal extended from a crystal resonator, and the substrate is a circuit substrate in which the lead terminal is inserted into a through hole; and the metal lead has a diameter of not less than 0.2 mm but not more than 1.4 mm, and a ratio of the metal lead to the through hole in terms of diameter is not less than 0.4 but not more than 0.7.

In the present invention, the oven controlled crystal oscillator is such that: the metal lead is a lead terminal extended from a circuit substrate of the oscillator, and the substrate is a base in which the lead terminal is inserted into a through hole; and the metal lead has a diameter of not less than 0.2 mm but not more than 1.4 mm, and a ratio of the metal lead to the through hole in terms of diameter is not less than 0.6 but not more than 0.9.

The present invention is a production method of an oven controlled crystal oscillator, and includes the steps of: forming, in a substrate, a through hole for passing a metal lead therethrough; forming pre-tinning solders around openings on a front surface and a rear surface of the substrate; inserting a metal lead including a solder layer formed on its surface into the through hole of the substrate; and soldering the metal lead extending from the openings, to the openings of the front surface and the rear surface of the substrate. As a result, in the case where the metal lead is soldered to the substrate, even if cracks occur in the solder, it is advantageously possible to secure reliability.

In the present invention, the production method of an oven controlled crystal oscillator is such that the pre-tinning solders are adjusted so as to be formed around the openings on the front surface and the rear surface of the substrate, but not to be formed in the through hole.

In the present invention, the production method of an oven controlled crystal oscillator is such that: the metal lead has a diameter of not less than 0.2 mm but not more than 2.0 mm, and a ratio of the metal lead to the through hole in terms of diameter is not less than 0.5 but not more than 0.9.

In the present invention, the production method of an oven controlled crystal oscillator is such that: the metal lead is a lead terminal extended from a crystal resonator, and the substrate is a circuit substrate in which the lead terminal is inserted into a through hole; and the metal lead has a diameter of not less than 0.2 mm but not more than 1.4 mm, and a ratio of the metal lead to the through hole in terms of diameter is not less than 0.4 but not more than 0.7.

In the present invention, the production method of an oven controlled crystal oscillator is such that: the metal lead is a lead terminal extended from a circuit substrate of the oscillator, and the substrate is a base in which the lead terminal is inserted into a through hole; and the metal lead has a diameter of not less than 0.2 mm but not more than 1.4 mm, and a ratio of the metal lead to the through hole in terms of diameter is not less than 0.6 but not more than 0.9.

BRIEF DESCRIPTION OF THE DRAWINGS

FIG. 1 is a cross-sectional explanatory view showing a state where pre-tinning solders are formed on a substrate of an oven controlled crystal oscillator according to an embodiment of the present invention.

FIG. 2 is a cross-sectional explanatory view showing a state where a metal lead is inserted into the substrate.

FIG. 3 is a cross-sectional explanatory view showing a state where main soldering is performed.

DESCRIPTION OF REFERENCE NUMERALS

1 . . . Substrate, 2 . . . Pre-tinning solder, 3 . . . Metal lead, 4 . . . Pre-tinning solder, 5 . . . Main solder

DESCRIPTION OF PREFERRED EMBODIMENT

An embodiment of the present invention is described with reference to drawings.
[Summary of Preferred Embodiment]
An oven controlled crystal oscillator according to an embodiment of the present invention is configured such that: pre-tinning solders are formed around openings of a front surface and a rear surface of a substrate in which a through hole for passing a metal lead therethrough is formed; and in a state where a metal lead including a solder layer on its surface is inserted into the through hole of the substrate, the metal lead extended from the openings is soldered to the openings on the front surface and the rear surface of the substrate. In a case where the metal lead is soldered to the substrate, this configuration allows the oven controlled crystal oscillator to ensure its reliability even if cracks occur in the solder.

The following describes the oven controlled crystal oscillator (the present oscillator) according to the embodiment of the present invention with reference to FIG. 1 to FIG. 3. FIG. 1 is a cross-sectional explanatory view showing a state where pre-tinning solders are formed on a substrate of the oven controlled crystal oscillator according to the embodiment of the present invention; FIG. 2 is a cross-sectional explanatory view showing a state where a metal lead is inserted into the substrate; and FIG. 3 is a cross-sectional explanatory view showing a state where main soldering is performed.
[Performing of Pre-tinning Soldering: FIG. 1]

As shown in FIG. 1, a through hole for passing a metal lead 3 therethrough is formed in a substrate 1 made from a glass epoxy resin or the like, and pre-tinning solders 2 are applied around (in a periphery of) the through hole on a front surface and a rear surface of the substrate 1.

Here, as for the metal lead (a lead wire), a base lead and a crystal lead are described.

A base lead is a lead terminal for connecting a circuit substrate and a base, and for example, a lead terminal formed (extended) on the circuit substrate of the oscillator is inserted into a through hole of the base to be connected thereto.

Meanwhile, a crystal lead is a lead terminal for connecting a crystal component and the circuit substrate, and for example, a lead terminal extended from a crystal resonator that contains a crystal blank is inserted into a through hole of the circuit substrate to be connected thereto.

For the base lead, the diameter of the through hole is, for example, 1.0 mm, and the diameter of the base lead is, for example, 0.8 mm.

Meanwhile, for the crystal lead, the diameter of the through hole is, for example, 0.8 mm, and the diameter of the crystal lead is, for example, 0.43 mm.

Note that the pre-tinning solder 2 has a thickness of about 1 μm for both the base lead and the crystal lead.

Since FIG. 1 is a cross-sectional explanatory view, the shape of the pre-tinning solder 2 is not illustrated, but the pre-tinning solders 2 are formed in a shape like a doughnut around the circular openings on the front surface and the rear surface of the substrate 1.

Further, the through hole has a diameter that is adjusted so as to fit the shape of the metal lead 3. In view of this, pre-tinning soldering is performed so that the pre-tinning solders 2 do not get into an inner wall of the through hole.

The pre-tinning solder 2 is a solder which contains tin as a main component, and one in which silver, copper, bismuth, indium and the like are mixed with tin may be used.

[Metal Lead Insertion: FIG. 2]

Next will be explained a state where the metal lead 3 is inserted into the through hole of the substrate 1.

The metal lead 3 is a lead in which kovar is plated with nickel, and in the present embodiment, a pre-tinning solder 4 is further applied to a surface of the metal lead 3.

The metal lead to which the pre-tinning solder 4 is applied has a diameter of 0.2 to 2.0 mm.

A ratio of the diameter of the metal lead to the diameter of the through hole is 0.5 to 0.9, and a gap is formed between the through hole and the metal lead.

More specifically, the diameter of the metal lead, including the crystal lead and the base lead, is about 0.2 to 1.4 mm. An optimum value of the ratio of the lead to the through hole in terms of diameter is 0.4 to 0.7 for the crystal lead, and about 0.6 to 0.9 for the base lead.

As shown in FIG. 2, the metal lead 3 is inserted into the through hole of the substrate 1 so as to be positioned.

[Performing of Main Soldering: FIG. 3]

Further, a base portion of the metal lead 3 extending from the opening of the through hole of the substrate 1 is soldered to a portion where the pre-tinning solder 2 is applied. This soldering may be performed by hand soldering. Further, this solder is called "a main solder" relative to the pre-tinning solder 2.

The solder portion (a main solder 5) formed of the main solder is formed not only on the front surface of the substrate 1 but also on the rear surface thereof in the same manner.

Further, the main solder 5 is formed so as to close (fill) a gap between the through hole and the metal lead. This rarely causes poor conduction even if cracks occur in the main solder, thereby making it advantageously possible to improve long-term reliability.

The main solder 5 is a solder which contains tin as a main component and which may be mixed with silver, copper, bismuth, indium and the like in addition to tin. With the use of this material, soldering is performed so as to cover the pre-tinning solder 2 in a horizontal direction of the substrate 1, as shown in FIG. 3.

Then, the main solder 5 is fused and integrated with the pre-tinning solder 2, which is formed around the opening of the through hole of the substrate 1, and the pre-tinning solder 4 applied to the surface of the metal lead 3.

Moreover, the main solder 5 is formed at the openings of the through hole on both of the front surface and the rear surface of the substrate 1. In view of this, the metal lead 3 can be attached more rigidly in comparison with the case where soldering is performed only on one side.

As such, the main solder 5 is integrated with the pre-tinning solders 2 and 4, and is formed on either side of the substrate 1. Thus, even if cracks occur in the main solder 5 for a stress caused by a heat cycle, poor conduction rarely occurs, thereby making it possible to improve long-term reliability.

[Effects of Embodiments]

The present oscillator is configured such that: pre-tinning solders 2 are formed around openings on a front surface and a rear surface of a substrate 1 in which a through hole for passing a metal lead 3 therethrough is formed; and in a state where the metal lead 3 including a solder layer (a pre-tinning solder) 4 formed on its surface is inserted into the through hole of the substrate 1, the metal lead 3 extending from the openings is soldered to the openings on the front surface and the rear surface of the substrate 1. According to the present oscillator, in the case where the metal lead 3 is soldered to the substrate 1, even if cracks occur in the solder (the main solder 5), poor conduction rarely occurs, thereby making it advantageously possible to improve long-term reliability.

The present invention is preferably applicable to an oven controlled crystal oscillator in which in a case where a metal lead is soldered to a substrate, even if cracks occur in the solder, its reliability can be ensured, and to a production method of the oven controlled crystal oscillator.

What is claimed is:

1. An oven controlled crystal oscillator, wherein:
   pre-tinning solders are formed around openings on a front surface and a rear surface of a substrate in which a through hole for passing a metal lead therethrough is formed so that the pre-tinning solders do not get into an inner wall of the through hole; and
   in a state where a metal lead including a solder layer formed on its surface is inserted into the through hole of the substrate, the metal lead extending from the openings are soldered to the openings on the front surface and the rear surface of the substrate so as to fill a gap between the through hole and the metal lead.

2. The oven controlled crystal oscillator according to claim 1, wherein:
   the metal lead has a diameter of not less than 0.2 mm but not more than 2.0 mm, and a ratio of the metal lead to the through hole in terms of diameter is not less than 0.5 but not more than 0.9.

3. The oven controlled crystal oscillator according to claim 1, wherein:
   the metal lead is a lead terminal extended from a crystal resonator and the substrate is a circuit substrate in which the lead terminal is inserted into a through hole; and
   the metal lead has a diameter of not less than 0.2 mm but not more than 1.4 mm, and a ratio of the metal lead to the through hole in terms of diameter is not less than 0.4 but not more than 0.7.

4. The oven controlled crystal oscillator according to claim 1, wherein:
   the metal lead is a lead terminal extended from a circuit substrate of the oscillator, and the substrate is a base in which the lead terminal is inserted into a through hole; and
   the metal lead has a diameter of not less than 0.2 mm but not more than 1.4 mm, and a ratio of the metal lead to the through hole in terms of diameter is not less than 0.6 but not more than 0.9.

5. A production method of an oven controlled crystal oscillator, comprising the steps of:
   forming, in a substrate, a through hole for passing a metal lead therethrough;
   forming pre-tinning solders around openings on a front surface and a rear surface of the substrate so that the pre-tinning solders do not get into an inner wall of the through hole;
   inserting a metal lead including a solder layer formed on its surface into the through hole of the substrate; and
   soldering the metal lead extending from the openings, to the openings on the front surface and the rear surface of the substrate so as to fill a gap between the through hole and the metal lead.

6. The production method of an oven controlled crystal oscillator according to claim 5, wherein:

the metal lead has a diameter of not less than 0.2 mm but not more than 2.0 mm, and a ratio of the metal lead to the through hole in terms of diameter is not less than 0.5 but not more than 0.9.

7. The production method of an oven controlled crystal oscillator according to claim 5, wherein:

the metal lead is a lead terminal extended from a crystal resonator, and the substrate is a circuit substrate in which the lead terminal is inserted into a through hole; and the metal lead has a diameter of not less than 0.2 mm but not more than 1.4 mm, and a ratio of the metal lead to the through hole in terms of diameter is not less than 0.4 but not more than 0.7.

8. The production method of an oven controlled crystal oscillator according to claim 5, wherein:

the metal lead is a lead terminal extended from a circuit substrate of the oscillator, and the substrate is a base in which the lead terminal is inserted into a through hole; and the metal lead has a diameter of not less than 0.2 mm but not more than 1.4 mm, and a ratio of the metal lead to the through hole in terms of diameter is not less than 0.6 but not more than 0.9.

* * * * *